United States Patent
Yang et al.

(10) Patent No.: US 6,858,487 B2
(45) Date of Patent: Feb. 22, 2005

(54) METHOD OF MANUFACTURING A SEMICONDUCTOR DEVICE

(75) Inventors: Ming-Sheng Yang, Hsin-Chu (TW); Water Lur, Taipei (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 10/334,902

(22) Filed: Jan. 2, 2003

(65) Prior Publication Data

US 2004/0132259 A1 Jul. 8, 2004

(51) Int. Cl.⁷ .................... H01L 21/8238; H01L 21/336
(52) U.S. Cl. .................... 438/231; 438/302; 438/301; 438/305
(58) Field of Search .................... 438/231, 302, 438/301, 305, 586, 583, 647, 674, 682

(56) References Cited

U.S. PATENT DOCUMENTS

| | | | |
|---|---|---|---|
| 4,998,150 A | | 3/1991 | Rodder et al. |
| 5,156,994 A | * | 10/1992 | Moslehi ..................... 438/647 |
| 5,677,214 A | | 10/1997 | Hsu |
| 6,165,903 A | * | 12/2000 | Besser et al. .............. 438/682 |
| 6,218,711 B1 | | 4/2001 | Yu |
| 6,391,750 B1 | * | 5/2002 | Chen et al. ................. 438/583 |
| 6,545,326 B2 | * | 4/2003 | Fukada et al. ............. 438/302 |
| 6,610,564 B2 | * | 8/2003 | Fukada et al. ............. 438/231 |

* cited by examiner

Primary Examiner—John F. Niebling
Assistant Examiner—Walter L. Lindsay, Jr.
(74) Attorney, Agent, or Firm—Birch, Stewart, Kolasch & Birch, LLP

(57) ABSTRACT

The present invention disclosed a method for manufacturing a semiconductor device on a semiconductor substrate, the method comprising the steps of: forming a gate dielectric layer on the semiconductor substrate. A gate is formed on the gate dielectric layer. A first ion implantation is performed to form extended source and drain shallow junctions in the semiconductor substrate. Spacer are formed on the side wall of the gate with liner between the gate and the spacers. The source and drain region is formed by performing a second ion implantation. A thermal annealing is used to eliminate the implantation defect and active the dopants. A surface treatment is used to form selective polycrystalline silicon on the gate and the source and drain region, thereby forming raised source and drain. A Cobalt layer is formed on the selective polycrystalline silicon. The Cobalt layer is reacted with the selective polycrystalline silicon on the gate and the raised source and drain region to form Cobalt silicide to eliminate the surface defect and lower sheet resistance of the source/drain regions.

22 Claims, 2 Drawing Sheets

METHOD OF MANUFACTURING A SEMICONDUCTOR DEVICE

BACKGROUND OF THE INVENTION

1. Field of the Invention

The present invention relates to a method of forming semiconductor device, and more specifically, to a method of fabricating a metal oxide semiconductor field effect transistor (MOSFET) with raised extended source and drain structure for used in deep sub-micron meter range.

2. Description of the Prior Art

The semiconductor industry has been advanced in an ever brisk pace, recently. In order to achieve high performance integrated circuits or high package density of a wafer, the sizes of semiconductor devices have become smaller and smaller than before in the field of Ultra Large Scale Integrated (ULSI) technologies. The semiconductor industry has been advanced to the field of Ultra Large Scale Integrated (ULSI) technologies. The fabrication of the metal-oxide-semiconductor transistor also follows the trend. As the size of the devices is scaled down, silicon based nano-scale electronics have been attention for these years. Integrated circuits includes more than millions devices in a specific area of a wafer and electrically connecting structure for connecting these devices to perform desired function. One of the typical devices is metal oxide semiconductor field effect transistor (MOSFET). The MOSFET has been widely, traditionally applied in the semiconductor technologies. As the trend of the integrated circuits, the fabrication of the MOSFET also meets various issues to fabricate them. The typically issue that relates to hot carriers injection is overcame by the development of lightly doped drain (LDD) structure.

Further, the requirement of the devices towards high operation speed and low operation power. For deep sub-micron meter MOS devices, the self-aligned silicide (SALICIDE) contact, ultra-shallow source and drain junction are used for improving the operation speed and short channel effect. In the prior research, the $CoSi_2$, NiSi have been used for deep sub-micron high speed CMOS due to the low sheet resistance of fine silicide line. However, it is difficult to make ultra-shallow junction and form SALICIDE contact without degrading the device performance.

The requirement of the ULSI CMOS technology is the need of devices operated at low supply voltage and they have high speed. When the supply-voltage is-reduced, the threshold voltage needs to be scaled down to achieve the desired circuit switching speed. IBM has proposed that CMOS employs non-uniform channel doping profiles and ultra-shallow source and drain extensions and halos, which can be referenced in "CMOS technology scaling 0.1 $\mu$m and beyond, IBM semiconductor research and development center, Bijan Davari, 1996, IEDM, 96–555". For the high performance case, the threshold voltage is scaled down less than the supply voltage in order to maintain a reasonable standby current.

Please refer to FIG. 1, it shows prior source and drain structure. As illustrates in the FIG. 1, a gate 4a is formed over a substrate 2a. The side wall of the gate is surrounded by a dielectric layer 8a, and side wall spacers 6a formed thereon. Source/drain 10a is in the substrate 2a and the source/drain extension 15a is adjacent to the source/drain 10a. Silicide layer 12a is formed on the exposed silicon surface. Once the source/drain extension becomes shallower, the distance between Co-silicide and ultra shallow junction becomes shorter. Then, the junction leakage (the dash line area 14) or punch through issue is enhanced. As the extended source and drain junction becomes shallower, the distance between source and drain silicide and junction becomes shorter. This causes the current leakage issue from the ultra shallow junction area. One of the method is to form the raised source and drain structure. However, as the devices become smaller and smaller, the interfacial stress between silicide and source/drain area becomes more and more serious.

U.S. Pat. No. 6,165,903 which assigned to Advanced Micro Devices, the prior art includes to form metal silicide on the gate and source/drain junction. A silicon layer is formed on substrate to react with the metal silicide, thereby forming raised metal silicide on the source/drain region. The deposited silicon is a source of silicon that is employed as a diffusion species during the transformation of the high resistivity metal silicide to a low resistivity metal silicide. However, the tremendous stress of the epitaxy silicide layer formed by metal and silicon substrate generates defect under source/drain regions for sub-0.1 micron meter technology.

U.S. Pat. No. 4,998,150 which assigned to Texas Instruments Incorporated, entitled 'Raised source/drain transistor'. In the structure, a raised source/drain transistor is provided having thin sidewall spacing insulators adjacent the transistor gate. A first sidewall spacer is disposed adjacent thin sidewall spacing insulator and raised source/drain region. A second sidewall spacer is formed at the interface between field insulating region and raised source/drain region. One of the aspects of the present invention includes the formation of a raised source/drain transistor that accommodates controlled doping of ultra-shallow junctions subsequent to the deposition of the raised regions. In comparison to prior processes, this aspect of the present invention prevents uncontrolled movement of previously implanted dopants during the process of depositing the raised source/drain region. Further, U.S. Pat. Nos. 5,677,214 and 6,218,711 describe a selective raised source/drain. If the raised source/drain epitaxy layer followed by metal silicide formed on the top of the raised source/drain area thus impacts the sub-0.1 micron meter performance. If the raised source/drain area is polycrystalline, the remained polycrystalline Si layer below the metal silicide layer should reduce the electron/hole mobility of the device.

SUMMARY OF THE INVENTION

The object of the present invention is to provide raised source/drain structure with raised polyscrystalline metal siicide layer that can obtain lower interface stress and better electronic properties without junction leakage under source/drain extension region.

The present invention disclosed a method for manufacturing a semiconductor device on a semiconductor substrate, the method comprising the steps of: forming a gate dielectric layer on the semiconductor substrate. A gate is formed on the gate dielectric layer. A first ion implantation is performed to form extended source and drain shallow junctions in the semiconductor substrate. Spacer are formed on the side wall of the gate with liner between the gate and the spacers. The source and drain region is formed by performing a second ion implantation. A thermal annealing is used to eliminate the implantation defect and active the dopants. A surface treatment is used to form selective polycrystalline silicon on the gate and the source and drain region, thereby forming raised source and drain. A Cobalt layer is formed on the selective polycrystalline silicon. The Cobalt layer is reacted with the selective polycrystalline silicon on the gate and the raised source and drain region to form Cobalt silicide to eliminate the surface defect and lower sheet resistance of the source/drain regions. The temperature for forming the metal silicide is between about 450 degree–850 degrees C. The raised source and drain is totally consumed to form the metal silicide to obtain better electronic properties. The surface treatment comprises ion bombard.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

Figure 1:
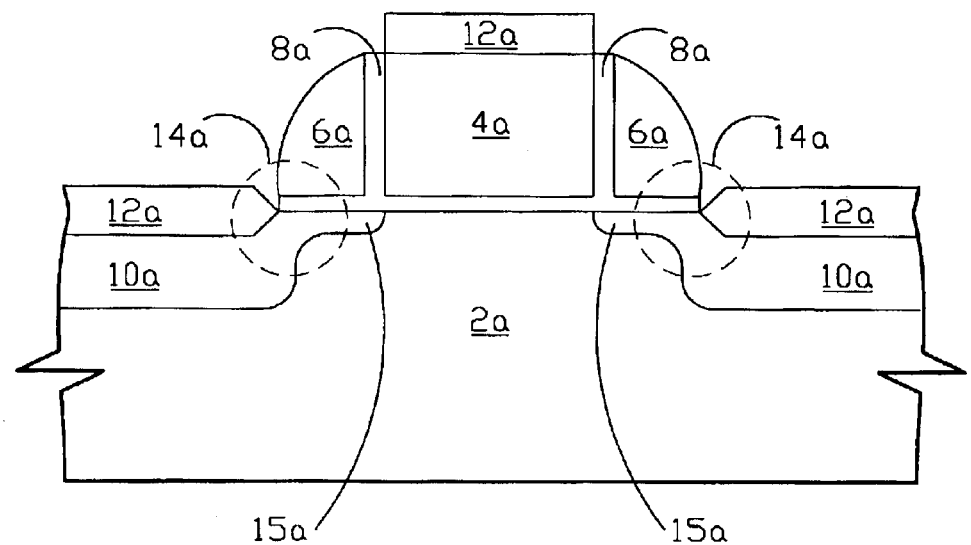
FIG. 1 is a cross section view of a semiconductor wafer illustrating the raised source/drain according to the prior art.
Figure 2:
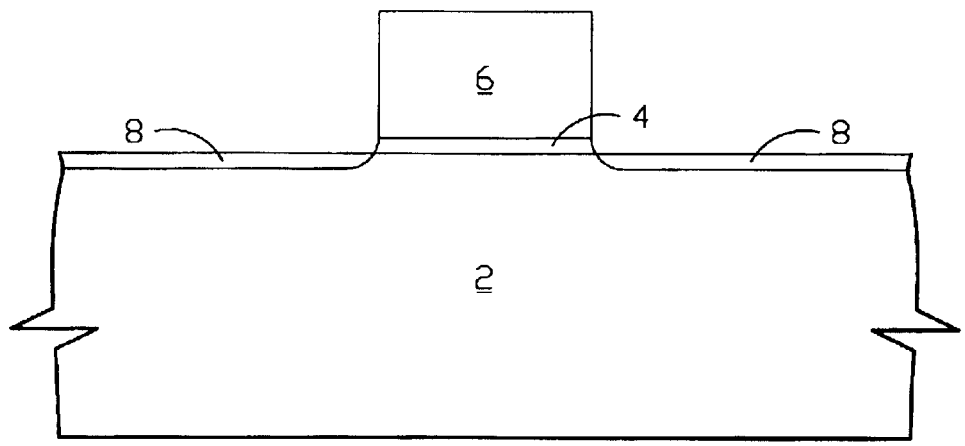
FIG. 2 is a cross section view of a semiconductor wafer illustrating the step of forming ultra-shallow source and drain junction according to the present invention.

The present invention proposes a novel method to fabricate for MOSFETS with raised source/drain structure. In the present invention, the technology can increase the device performance. Turning to FIG. 2, in a preferred embodiment, a single crystal silicon substrate 2 with a <100> crystallographic orientation is provided. Thick field oxide (FOX) regions or shallow trench isolation are formed to provide isolation between devices on the substrate. As known in the art, the FOX regions can be replaced by a plurality of shallow trench isolations.

A dielectric layer 4 is then formed over the substrate 2 using a low-pressure chemical vapor deposition process. In preferred embodiment, the dielectric layer 4 is formed of oxide, nitride, oxynitride on the top surface of the substrate 2 to serve as a gate oxide of a subsequently formed MOSFET. Typically, the silicon dioxide layer 6 is formed in oxygen ambient at a temperature of about 800 to 1100 centigrade degrees. In the embodiment, the thickness of the silicon dioxide layer 6 is approximately 10–250 angstroms. Alternatively, the oxide layer 6 may be formed using any suitable oxide chemical compositions and procedures, such as chemical vapor deposition. Subsequently, a polysilicon layer 6 is formed on the dielectric layer 4. Next, a photolithography process is introduced to remove a portion of the polysilicon layer 6 and the dielectric layer 4 for forming the gate, as shown in FIG. 2.

Turning to FIG. 2, a low energy implantation is performed to implant ions into the substrate exposed by the gate 6 to form the extended source/drain ultra shallow junction 8 in the substrate. The energy of the implantation is about 1~30 keV, and concentration of the dopant is about $1 \times 10^{14}$~$8 \times 10^{15}$ atoms/cm$^2$.

Figure 3:
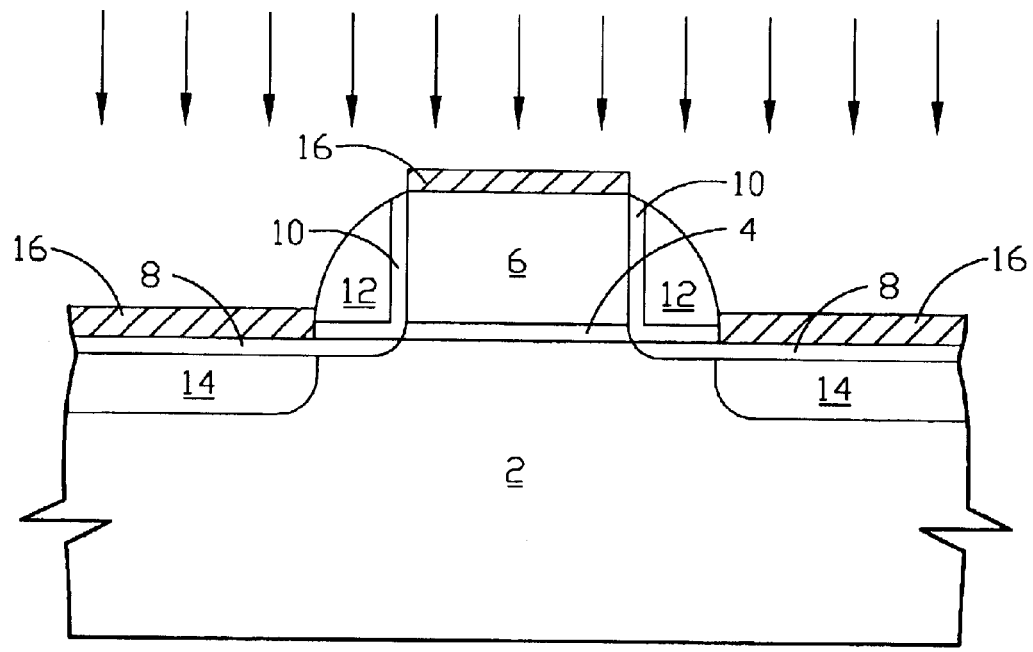
FIG. 3 is a cross section view of a semiconductor wafer illustrating the step of performing surface treatment according to the present invention.

Refer to FIG. 3, a liner 10 formed by oxide is formed along the surface of the gate 6. This may be formed by CVD technique. Then, nitride or oxide spacers 12 are formed on the sides of the polysilicon gate 6. This can be achieved by deposition and anisotropically etching process. Next, source and drain regions 14 are formed by performing an ion implantation using the spacers 12 as a mask. A rapid thermal anneal (RTA) step is then performed at a temperature of between about 450 degree to 700 degree C. in a nitrogen atmosphere for annealing to eliminate the implant defect and active the dopants. Then, the surface treatment, indicated by the arrows in FIG. 3, is used to form the selective polycrystalline silicon. For example, this may be achieved by using ion bombard technology using argon, nitrogen or the combination thereof as the source. The selective polycrystalline silicon 16 is formed on the top of the gate 6 and the surface of the source and drain 14, thereby forming raised source/drain.

Figure 4:
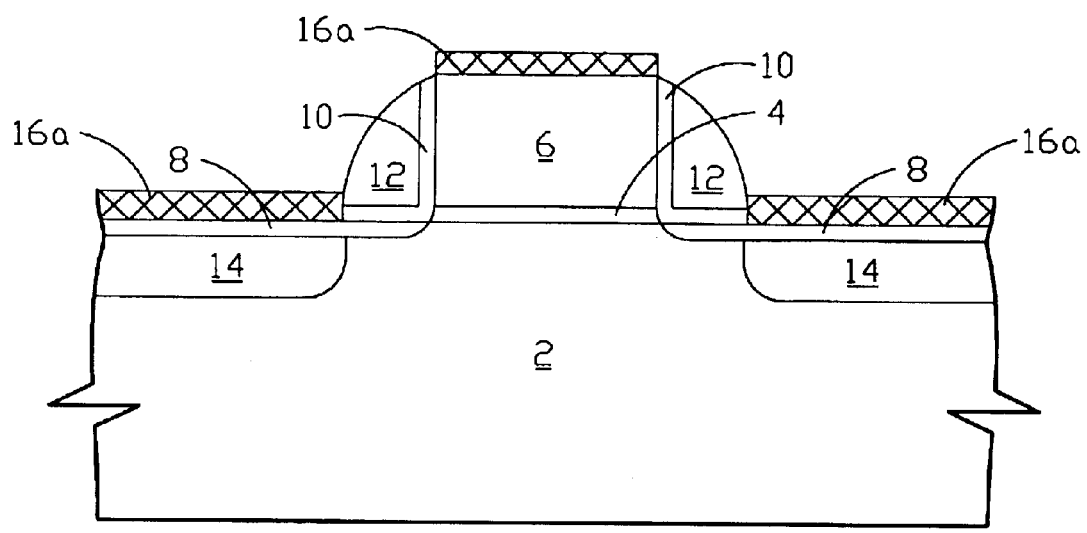
FIG. 4 is a cross section view of a semiconductor wafer illustrating the step of forming metal salicide according to the present invention.

As shown in FIG. 4, a refractory metal layer, comprising cobalt for example, is blanket deposited over the raised source/drain junctions 16 and the polysilicon gate 6 and the spacers 12. A rapid thermal anneal (RTA) step is then performed at a temperature of between about 450 degree–850 degree C. for a short period of time in a nitrogen atmosphere. The exposed silicon reacts with the metal to form silicide 16a in those regions where metal contacts with the silicon on the gate 6 and raised source/drain regions as depicted in FIG. 4. The raised source/drain layer should be totally consumed to form polycrystalline metal silicide to obtain better electronic properties. The selective polycrystalline silicon 16 is controlled to just consume the top surface of Si substrate to eliminate the surface defect and lower sheet resistance of the source/drain regions. The layer of refractory metal is deposited across the entire wafer by using physical vapor deposition system. In preferred embodiments, the metal is cobalt (Co). In the method, Cobalt silicide (CoSi.sub.2) has been introduced as the replacement for titanium silicide. Since cobalt silicide forms by a diffusion reaction and the advantages of cobalt over alternative materials such as platinum or palladium are that cobalt silicide provides low resistivity, allows lower-temperature processing. However, the use of cobalt in layer 42 as a refractory metal is exemplary only.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for manufacturing a semiconductor device on a semiconductor substrate, said method comprising the steps of:

forming a gate structure on said semiconductor substrate;

performing a first ion implantation by way of using said gate as a mask to form extended source and drain shallow junctions in said semiconductor substrate;

forming a spacer on the side wall of said gate;

forming a source and a drain region by performing a second ion implantation;

forming a selective polycrystalline silicon on said gate and said source and said drain region;

forming a metal layer on said selective polycrystalline silicon; and reacting said metal layer with said selective polycrystalline silicon on said gate and said raised source and drain region to form metal silicide.

2. The method of claim 1, further comprising a step of forming a liner between said gate and said spacer.

3. The method of claim 1, further comprising a step of performing a thermal annealing after said step of forming said source and said drain region.

4. The method of claim 1, wherein the temperature for forming said metal silicide is between about 450 degree–850 degrees C.

5. The method of claim 1, wherein said metal silicide is formed in a nitrogen atmosphere.

6. The method of claim 1, wherein said raised source and drain is totally consumed to form said metal silicide to obtain better electronic properties.

7. The method of claim 1, wherein said metal includes Cobalt.

8. The method of claim 7, wherein said metal salicide includes Cobalt silicide (CoSi.sub.2).

9. The method of claim 1, wherein said gate dielectric layer comprises silicon oixde, silicon oxynitride or silicon nitride.

10. The method of claim 1, wherein said spacers includes nitride.

11. The method of claim 1, wherein said liner comprises oxide.

12. The method of claim 1, wherein the energy of said first ion implantation is about 1~30 keV, and concentration of the dopant is about $1 \times 10^{14} \sim 8 \times 10^{15}$ atoms/cm$^2$.

13. The method of claim 1, wherein said surface treatment comprises ion bombard.

14. A method for manufacturing a semiconductor device on a semiconductor substrate, said method comprising the steps of:

forming a gate dielectric layer on said semiconductor substrate;

forming a gate on said gate dielectric layer;

performing a first ion implantation by way of using said gate as a mask to form extended source and drain shallow junctions in said semiconductor substrate;

forming a liner and a spacer on the side wall of said gate, wherein said liner is formed between said gate and said spacer;

forming a source and a drain region by performing a second ion implantation;

performing thermal annealing;

forming a selective polycrystalline silicon on said gate and said source and said drain region;

forming a Cobalt layer on said selective polycrystalline silicon; and reacting said Cobalt layer with said selective polycrystalline silicon on said gate and said raised source and drain region to form Cobalt silicide.

15. The method of claim 14, wherein the temperature for forming said Cobalt metal silicide is between about 450 degree–850 degrees C.

16. The method of claim 14, wherein said Cobalt silicide is formed in a nitrogen atmosphere.

17. The method of claim 14, wherein said raised source and drain is totally consumed to form said Cobalt silicide to obtain better electronic properties.

18. The method of claim 14, wherein said gate dielectric layer comprises silicon oixde, silicon oxynitride or silicon nitride.

19. The method of claim 14, wherein said spacers includes nitride.

20. The method of claim 14, wherein said liner comprises oxide.

21. The method of claim 14, wherein the energy of said first ion implantation is about 1~30 keV, and concentration of the dopant is about $1 \times 10^{14} \sim 8 \times 10^{15}$ atoms/cm$^2$.

22. The method of claim 14, wherein said surface treatment comprises ion bombard.

* * * * *

UNITED STATES PATENT AND TRADEMARK OFFICE
CERTIFICATE OF CORRECTION

PATENT NO. : 6,858,487 B2
DATED : February 22, 2005
INVENTOR(S) : Ming-Sheng Yang et al.

It is certified that error appears in the above-identified patent and that said Letters Patent is hereby corrected as shown below:

Column 5,
Line 9, after "drain region" insert -- by a surface treatment --.

Column 6,
Line 17, after "drain region" insert -- by a surface treatment --.

Signed and Sealed this

Seventh Day of June, 2005

JON W. DUDAS
*Director of the United States Patent and Trademark Office*